US011545555B2

(12) United States Patent
Feng et al.

(10) Patent No.: US 11,545,555 B2
(45) Date of Patent: Jan. 3, 2023

(54) GATE-ALL-AROUND (GAA) TRANSISTORS WITH SHALLOW SOURCE/DRAIN REGIONS AND METHODS OF FABRICATING THE SAME

(71) Applicant: QUALCOMM Incorporated, San Diego, CA (US)

(72) Inventors: Peijie Feng, San Diego, CA (US); Stanley Seungchul Song, San Diego, CA (US); Kern Rim, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 140 days.

(21) Appl. No.: 16/944,624

(22) Filed: Jul. 31, 2020

(65) Prior Publication Data

US 2022/0037493 A1    Feb. 3, 2022

(51) Int. Cl.
*H01L 29/423* (2006.01)
*H01L 29/167* (2006.01)
*H01L 29/78* (2006.01)
*H01L 29/06* (2006.01)

(52) U.S. Cl.
CPC .... *H01L 29/42392* (2013.01); *H01L 29/0669* (2013.01); *H01L 29/167* (2013.01); *H01L 29/7848* (2013.01)

(58) Field of Classification Search
CPC ......... H01L 29/42392; H01L 29/0669; H01L 29/167; H01L 29/7848
USPC ........................................................ 257/368
See application file for complete search history.

(56) References Cited

U.S. PATENT DOCUMENTS

| 2016/0308005 | A1  | 10/2016 | Feng et al. | |
|---|---|---|---|---|
| 2020/0303521 | A1* | 9/2020 | Son | H01L 29/42392 |
| 2021/0066452 | A1* | 3/2021 | Liaw | H01L 29/66439 |
| 2021/0066506 | A1* | 3/2021 | Liaw | H01L 29/66537 |
| 2021/0265489 | A1* | 8/2021 | Chen | H01L 29/0847 |
| 2021/0328012 | A1* | 10/2021 | Tsai | H01L 21/30604 |

* cited by examiner

*Primary Examiner* — Igwe U Anya
(74) *Attorney, Agent, or Firm* — W&T

(57) ABSTRACT

Gate-all-around (GAA) transistors with shallow source/drain regions and methods of fabricating the same provide a GAA transistor that includes one or more channels positioned between a source region and a drain region. The one or more channels, which may be nanowire, nanosheet, or nanoslab semiconductors, are surrounded along a longitudinal axis by gate material. At a first end of the channel is a source region and at an opposite end of the channel is a drain region. To reduce parasitic capacitance between a bottom gate and the source and drain regions, a filler material is provided adjacent the bottom gate, and the source and drain regions are grown on top of the filler material. In this fashion, the bottom gate does not abut the source region or the drain region, reducing geometries which would contribute to parasitic capacitance.

29 Claims, 10 Drawing Sheets

GATE-ALL-AROUND (GAA) TRANSISTORS WITH SHALLOW SOURCE/DRAIN REGIONS AND METHODS OF FABRICATING THE SAME

BACKGROUND

I. Field of the Disclosure

The technology of the disclosure relates generally to gate-all-around (GAA) transistors and, more particularly, to limiting parasitic capacitance therein.

II. Background

Transistors are essential components in modern electronic devices. Large numbers of transistors are employed in integrated circuits (ICs) in many modern electronic devices. For example, components such as central processing units (CPUs), graphics processing units (GPUs), and memory systems each employ a large quantity of transistors for logic circuits and memory devices. There is a desire to reduce the size of individual transistors to conserve die area so that more computing power may be made available in devices of the same size. The pressure to reduce the size of transistors has led to the use of gate-all-around (GAA) transistors where a gate element surrounds a channel of the transistor. By providing a gate around the channel, control over the channel is improved, particularly for short channels, relative to other gate geometries. Further pressures to reduce size in such GAA transistors have caused the rise of parasitic capacitance, which may limit performance of the resulting transistor.

SUMMARY OF THE DISCLOSURE

Aspects disclosed in the detailed description include gate-all-around (GAA) transistors with shallow source/drain regions and methods of fabricating the same. In exemplary aspects, a GAA transistor is provided. The GAA transistor includes one or more channels positioned between a source region and a drain region. The one or more channels, which may be nanowire, nanosheet, or nanoslab semiconductors, are surrounded along a longitudinal axis by gate material. At a first end of the channel is a source region and at an opposite end of the channel is a drain region. To reduce parasitic capacitance between a bottom gate section and the source and drain regions, a filler material is provided adjacent the bottom gate section, and the source and drain regions are grown on top of the filler material. The filler material may be relatively non-conductive compared to the source region or the drain region. In this fashion, the bottom gate section does not abut the source region or the drain region, reducing geometries which would contribute to parasitic capacitance.

In this regard in one aspect, an integrated circuit (IC) is disclosed. The IC includes a GAA transistor. The GAA transistor includes a first gate section positioned adjacent to a first surface. The first gate section has a gate top surface. The GAA transistor also includes one of a source filler and a drain filler positioned at one end of the first gate section and extending from the first surface to the gate top surface. The GAA transistor also includes one of a source region and a drain region positioned at one end of a channel, adjacent to the one of the source filler and the drain filler and extending up from a plane defined by the gate top surface.

In another aspect, a method for fabricating a GAA transistor is disclosed. The method includes forming a first gate having a gate top surface on a top surface of a substrate. The method also includes forming a channel on the gate top surface of the first gate. The method also includes forming a source filler adjacent to the first gate from the top surface of the substrate to at least the gate top surface of the first gate. The method also includes forming a drain filler adjacent to the first gate from the top surface of the substrate to at least the gate top surface of the first gate. The method also includes forming a source region on the source filler. The method also includes forming a drain region on the drain filler.

In another aspect, an IC is disclosed. The IC includes a substrate having a planar top surface. The IC also includes a GAA transistor positioned on top of the substrate. The GAA transistor includes a bottom gate positioned above the planar top surface and parallel to the planar top surface. The bottom gate has a gate top surface. The GAA transistor also includes a channel positioned above the gate top surface and parallel to the planar top surface. The GAA transistor also includes a source filler positioned at one end of the bottom gate and extending up from the planar top surface to the gate top surface. The GAA transistor also includes a source region positioned at one end of the channel, on top of the source filler and extending up from a plane defined by the gate top surface. The GAA transistor also includes a drain filler positioned at another end of the bottom gate and extending up from the planar top surface to the gate top surface. The GAA transistor also includes a drain region positioned at another end of the channel, on top of the drain filler and extending up from the plane defined by the gate top surface.

Figure 2A:
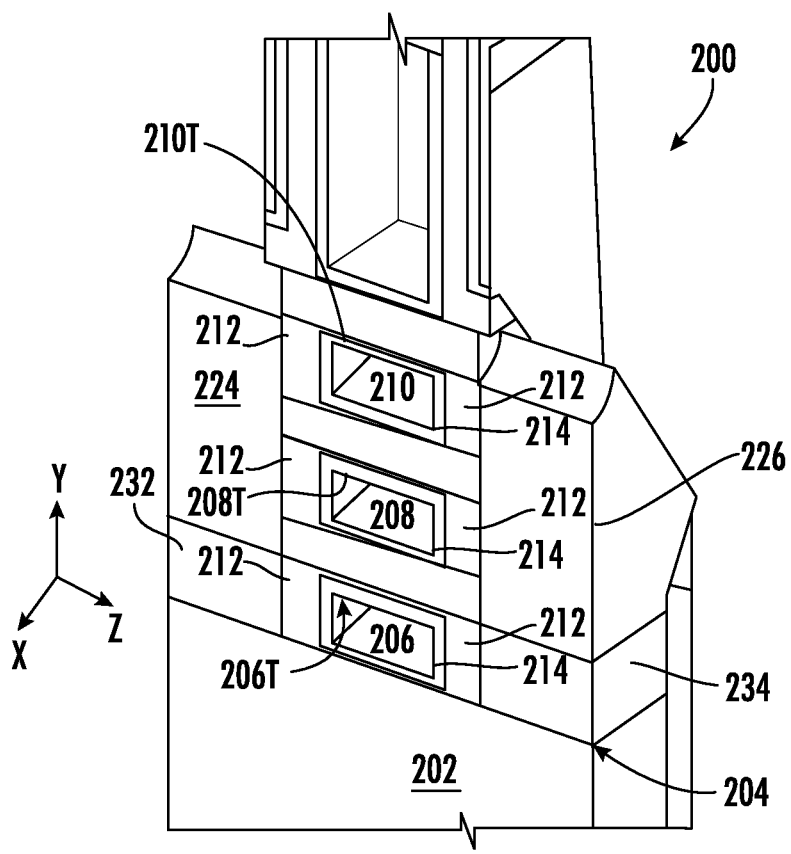
FIG. 2A is a cross-sectional perspective side view of a GAA transistor having a filler material adjacent to a bottom gate section to reduce parasitic capacitance according to an exemplary aspect of the present disclosure.
Figure 2B:
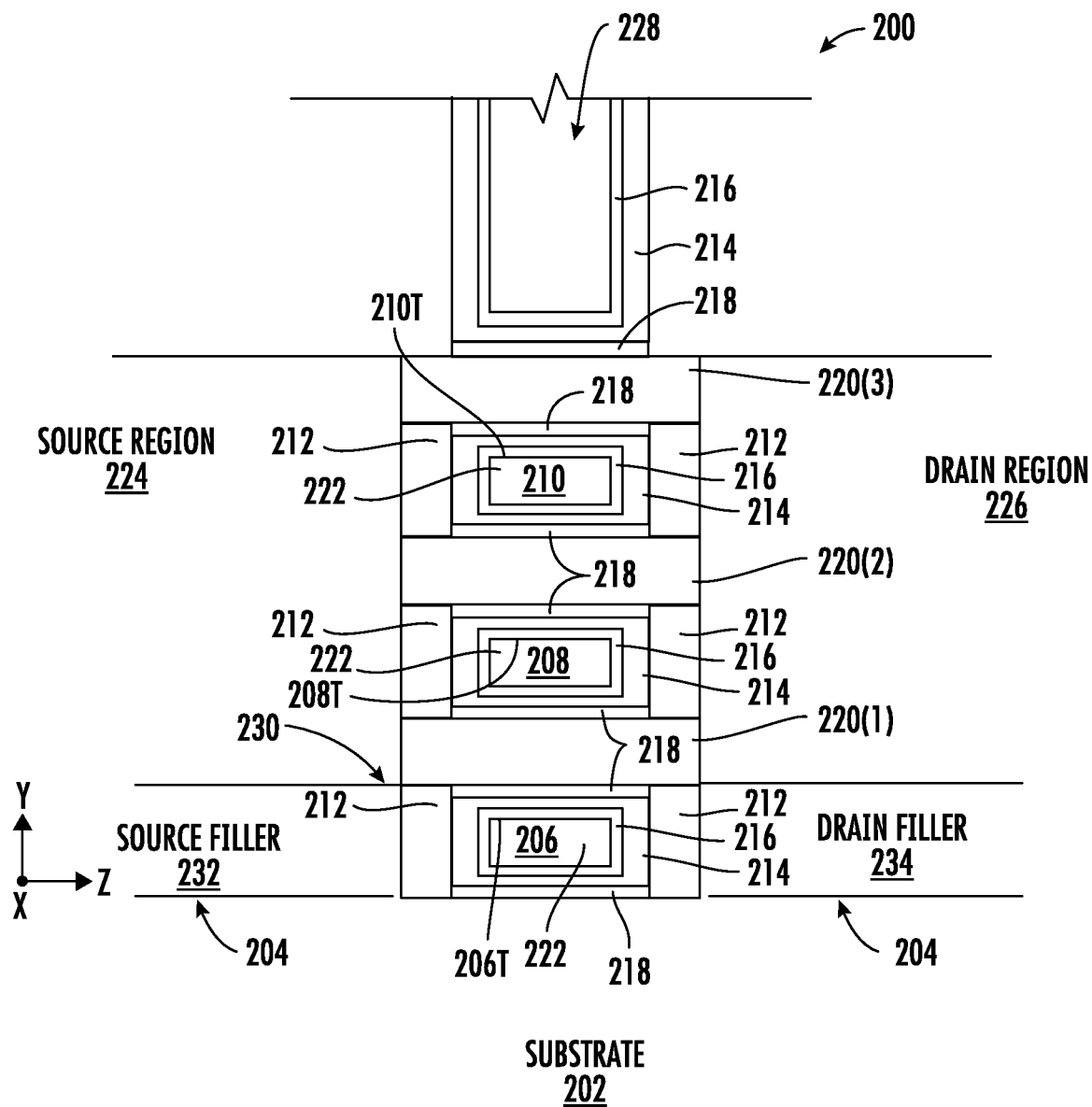
FIG. 2B is a cross-sectional side elevational view of the gate body of the GAA transistor of FIG. 2A.

components formed from an IC that may include GAA transistors such as the GAA transistor of FIGS. 2A and 2B.

DETAILED DESCRIPTION

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include gate-all-around (GAA) transistors with shallow source/drain regions and methods of fabricating the same. In exemplary aspects, a GAA transistor is provided. The GAA transistor includes one or more channels positioned between a source region and a drain region. The one or more channels, which may be nanowire, nanosheet or nanoslab semiconductors, are surrounded along a longitudinal axis by gate material. At a first end of the channel is a source region and at an opposite end of the channel is a drain region. To reduce parasitic capacitance between a bottom gate section and the source and drain regions, a filler material is provided adjacent the bottom gate section, and the source and drain regions are grown on top of the filler material. The filler material may be relatively non-conductive compared to the source region or the drain region. In this fashion, the bottom gate section does not abut the source region or the drain region, reducing geometries which would contribute to parasitic capacitance.

As better explained below, the filler material fills the space adjacent to the bottom section of the gate and helps prevent conductive material from occupying that space. Since there is less conductive material adjacent to the bottom section of the gate, there is less opportunity to form one of the plates of a capacitor, and thus, parasitic capacitance is reduced.

Figure 1B:
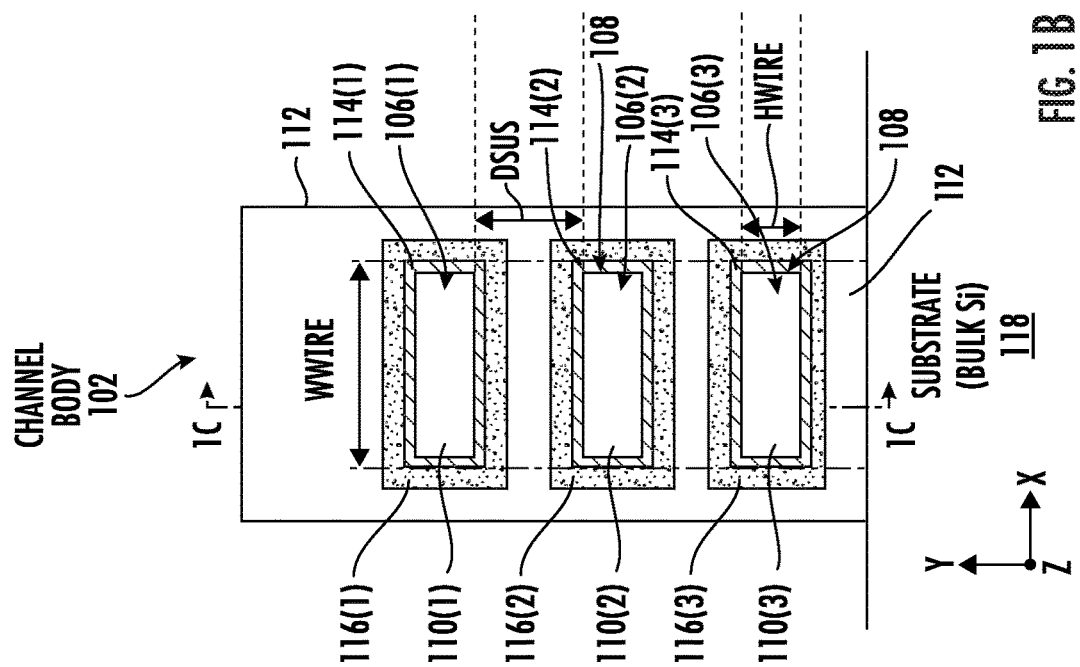
FIG. 1B is a cross-sectional side elevational view of the gate body of the GAA transistor of FIG. 1A.
Figure 1A:
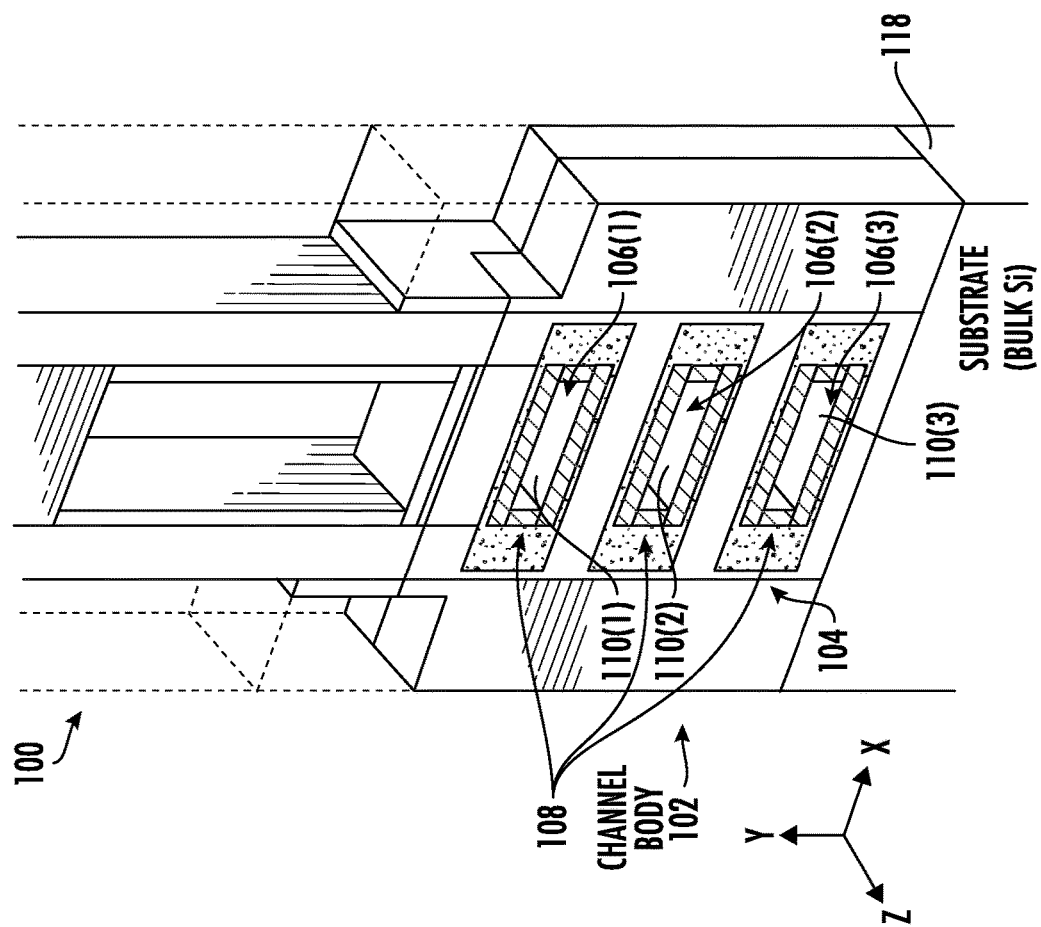
FIG. 1A is a perspective view of a conventional gate-all-around (GAA) transistor.

Before addressing particular aspects of the present disclosure, an overview of a conventional GAA transistor is provided with reference to FIGS. 1A-IC. This discussion permits highlighting where parasitic capacitance may occur and provide a point of context for the discussion of GAA transistors having shallow trenches and filler material therein to reduce parasitic capacitance according to the present disclosure, which begins below with reference to FIG. 2A.

In this regard, FIGS. 1A and 1B illustrate perspective and side elevational views, respectively, of an exemplary transistor, which may be a field-effect transistor (FET) and, more specifically, is a nanowire GAA transistor 100. Note that while the GAA transistor 100 may be considered a GAA FET, it is referred to herein as just a GAA transistor. As shown in FIG. 1A, the GAA transistor 100 includes a channel body 102 that includes a nanowire channel structure 104 that includes a plurality of nanowire structures 106(1)-106(3) that form a collective channel 108. The plurality of nanowire structures 106(1)-106(3) are arranged in a vertically (i.e., along the Y-axis) stacked arrangement to increase channel current density for a given channel body 102 height, and thus increase the effective channel width for increased drive strength (i.e., drive current). In this example, the nanowire structures 106(1)-106(3) are nanoslabs 110(1)-110(3) that are longer in the horizontal (X-axis) direction than they are tall in the vertical (Y-axis) direction.

FIG. 1B illustrates a side elevational view of the channel body 102 in the GAA transistor 100 in FIG. 1A. As shown in FIG. 1B, a gate material 112 in the form of a metal material completely surrounds the nanowire structures 106 (1)-106(3). An interfacial layer 114(1)-114(3) is disposed around the respective nanowire structures 106(1)-106(3) followed by a high-K dielectric material layer 116(1)-116(3) to insulate the gate material 112 from the nanowire structures 106(1)-106(3). Note that the interfacial layer 114(1)-114(3) and the high-K dielectric material layer 116(1)-116(3) are visible in FIG. 1A, but reference characters are omitted to avoid cluttering FIG. 1A. Applying a voltage to the gate material 112 controls an electric field in the nanowire structures 106(1)-106(3) to cause current to flow through the nanowire structures 106(1)-106(3) during an active mode.

The height (in the Y-axis) of each of the nanowire structures 106(1)-106(3) is of a height Hwire in this example. Adjacent nanowire structures 106(1)-106(3) are separated a distance Dsus from each other as shown in FIG. 1B. This distance Dsus is provided to allow the gate material 112 to be disposed completely around and between the adjacent nanowire structures 106(1)-106(3) so that the gate material 112 can have greater electrostatic control of the collective channel 108 formed by the nanowire structures 106(1)-106(3) of the GAA transistor 100. The distance Dsus may be fourteen (14) nanometers (nm) as an example in a conventional nanowire channel structure, such as the nanowire channel structure 104.

The channel body 102 may be formed on top of (i.e., in the Y-direction) a substrate 118 such as a bulk silicon (Si) body.

Figure 1C:
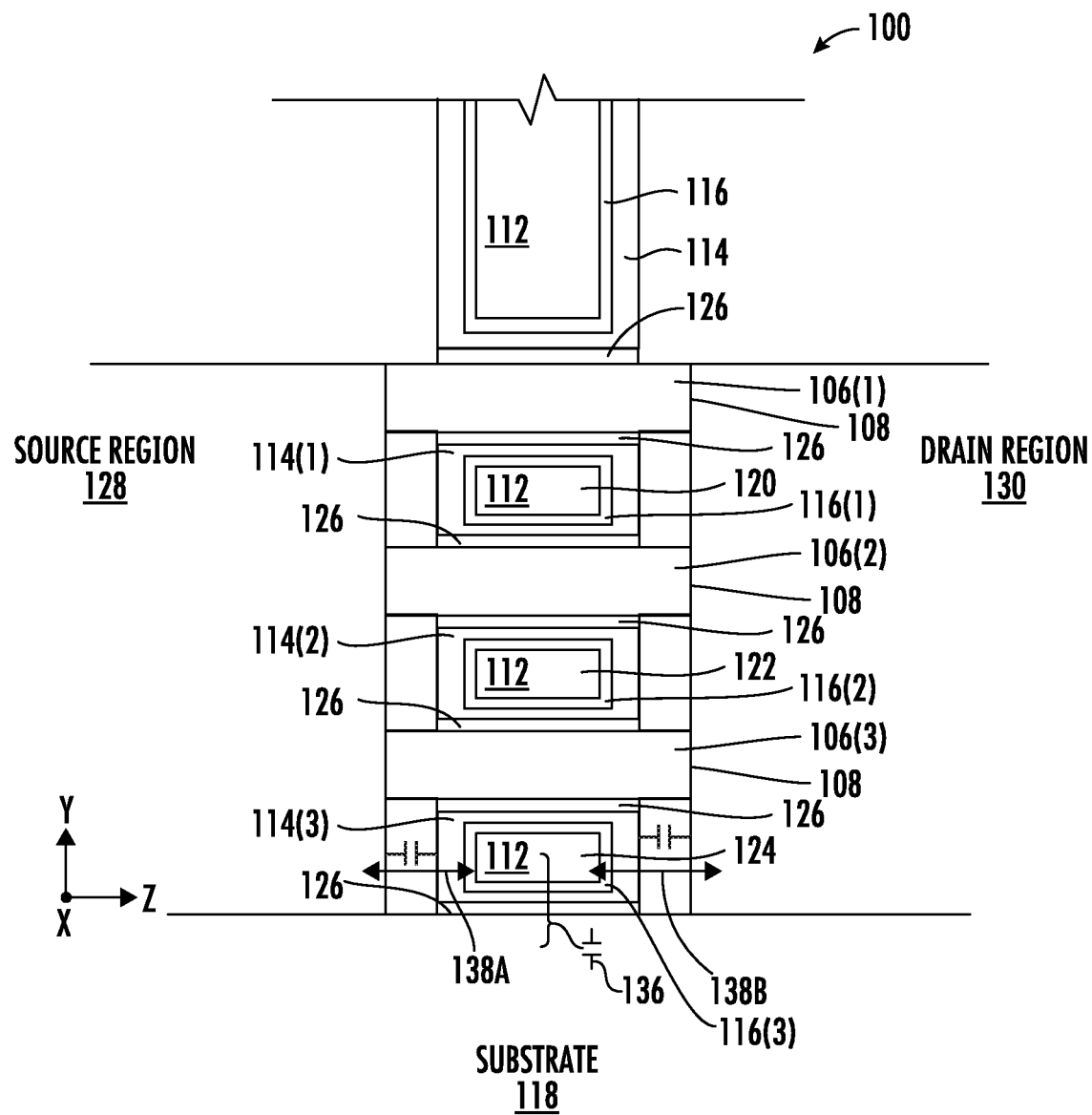
FIG. 1C is a cross-sectional side elevational view of the gate body of the GAA transistor of FIGS. 1A and 1B taken along the line 1C-1C of FIG. 1B.

FIG. 1C is a cross-sectional view of the channel body 102 taken along line 1C-1C of FIG. 1B. Because of the change in orientation, the nanowire structures 106(1)-106(3) forming the collective channel 108 now appear to sandwich the gate material 112 into a top gate section 120, middle gate section 122, and bottom gate section 124. While not illustrated in FIGS. 1A and 1B, the nanowire structures 106(1)-106(3) abut insulating material 126, and the interfacial layers 114(1)-114(3) are positioned closer to the gate sections 120, 122, 124 than such insulating material 126. The high-K dielectric material layers 116(1)-116(3) are directly adjacent the gate material 112.

With continued reference to FIG. 1C, it is now possible to see source region 128 and drain region 130. While the source region 128 is shown as being on the left side (using the Z-axis) of the collective channel 108 and the drain region 130 is shown as being on the right side of the collective channel 108, it should be appreciated that these may be switched without substantially changing the operation of the GAA transistor 100.

Capacitance may occur between two conductive materials separated by a non-conducting material. When planar materials are considered, the capacitance can be calculated from the area A of the "plates" and the space (d) between the plates according to the well understood equation:

$$C = \varepsilon_0 \frac{A}{d} \qquad \text{Equation 1}$$

where $\varepsilon_0$ is the electric constant ($\varepsilon_0 \approx 8.854 \times 10^{-12}$ F·m$^{-1}$). Accordingly, parasitic capacitance 136 may be formed between the bottom gate section 124 and the substrate 118. That is, the bottom gate section 124 may act as a first conductor and the substrate 118 may act as a second conductor, with capacitance therebetween as a function of the geometries of these bodies and the thickness of the dielectric materials between these bodies. Still further, parasitic capacitances 138A and 138B may exist between the bottom gate section 124 and the source region 128 and between the bottom gate section 124 and the drain region 130, respectively. That is, the conductive material of the bottom gate section 124 and conductive material of the source region 128 (or the drain region 130) are separated by dielectric material, and thus may form a capacitance therebetween. This parasitic capacitance may negatively impact performance, contribute to unwanted power consumption, and/or contribute to increased leakage current.

Exemplary aspects of the present disclosure provide a GAA transistor that reduces the parasitic capacitances 138A and 138B with improvements in performance by reducing the overlap between the source region 128 and the bottom gate section 124 as well as reducing the overlap between the drain region 130 and the bottom gate section 124 as better seen in FIGS. 2A and 2B. The reduction in the overlap reduces "A" in Equation 1, which in turn reduces the capacitance. The reduction in overlap may result in increased resistance in the source region 128 and the drain region 130, but this increased resistance is preferable to the parasitic capacitance in that the amount of increased resistance consumes less power than is made available by the reduction in parasitic capacitance. The reduction in overlap also does not materially affect the channel as there is no channel region at the point of overlap.

Turning now to FIGS. 2A and 2B, an exemplary aspect of a GAA transistor 200 with shallow source/drain regions according to the present disclosure is illustrated. In particular, the GAA transistor 200 sits on top of (in the Y-axis direction) a substrate 202. The substrate 202 may be a bulk silicon substrate, a silicon on insulator (SOI) substrate, or other substrate as is well known. The substrate 202 may have a planar top surface 204 that extends in a plane defined by the X and Z axes. A gate stack is formed from a bottom gate section 206, middle gate section 208, and top gate section 210 (where bottom, middle, and top are relative to the Y-axis) stacked above the planar top surface 204 of the substrate 202. Each gate section 206, 208, and 210 has respective spacers 212 on either side of the gate in the Z-axis direction. Additional interfacial layers 214, high-K dielectric material layers 216, and insulators 218 (shown in FIG. 2B) further surround the gate sections 206, 208, and 210 as is conventional. Sitting atop a respective gate top surface 206T, 208T, and 210T for each gate section 206, 208, and 210, but spaced therefrom by the interfacial layers 214, high-K dielectric material layers 216, and insulators 218, are respective nanostructures 220(1)-220(3), which may be nanowires, nanoslabs, nanosheets, or the like. The nanostructures 220(1)-220(3) are surrounded by gate material 222 of which only the gate sections 206, 208, and 210 are shown in FIGS. 2A and 2B. It should be appreciated that the gate material 222 extends along the X-axis into and out of the page in FIG. 2B and is interconnected vertically (along the Y-axis) similar to the gate material 112 of FIG. 1B. A gate electrode 228 sits on top of the uppermost (on the Y-axis) nanostructure 220(3). The nanostructures 220(1)-220(3) collectively form a channel with individual channel paths between a source region 224 and a drain region 226 when the gate sections 206, 208, and 210 are active when a voltage is applied to the gate electrode 228 as is well understood. That is, current may flow in the Z-axis direction along the nanostructures 220(1)-220(3). The gate electrode 228 may also have an interfacial layer 214, a high-K dielectric material layer 216, and an insulator 218 spacing the gate electrode 228 from the nanostructure 220(3).

Terms like "bottom," "top," and "middle" are terms of convenience and may equivalently be replaced with ordinal adjectives to distinguish between different elements having similar characteristics (e.g., first gate section, second gate section, third gate section).

Figure 5:
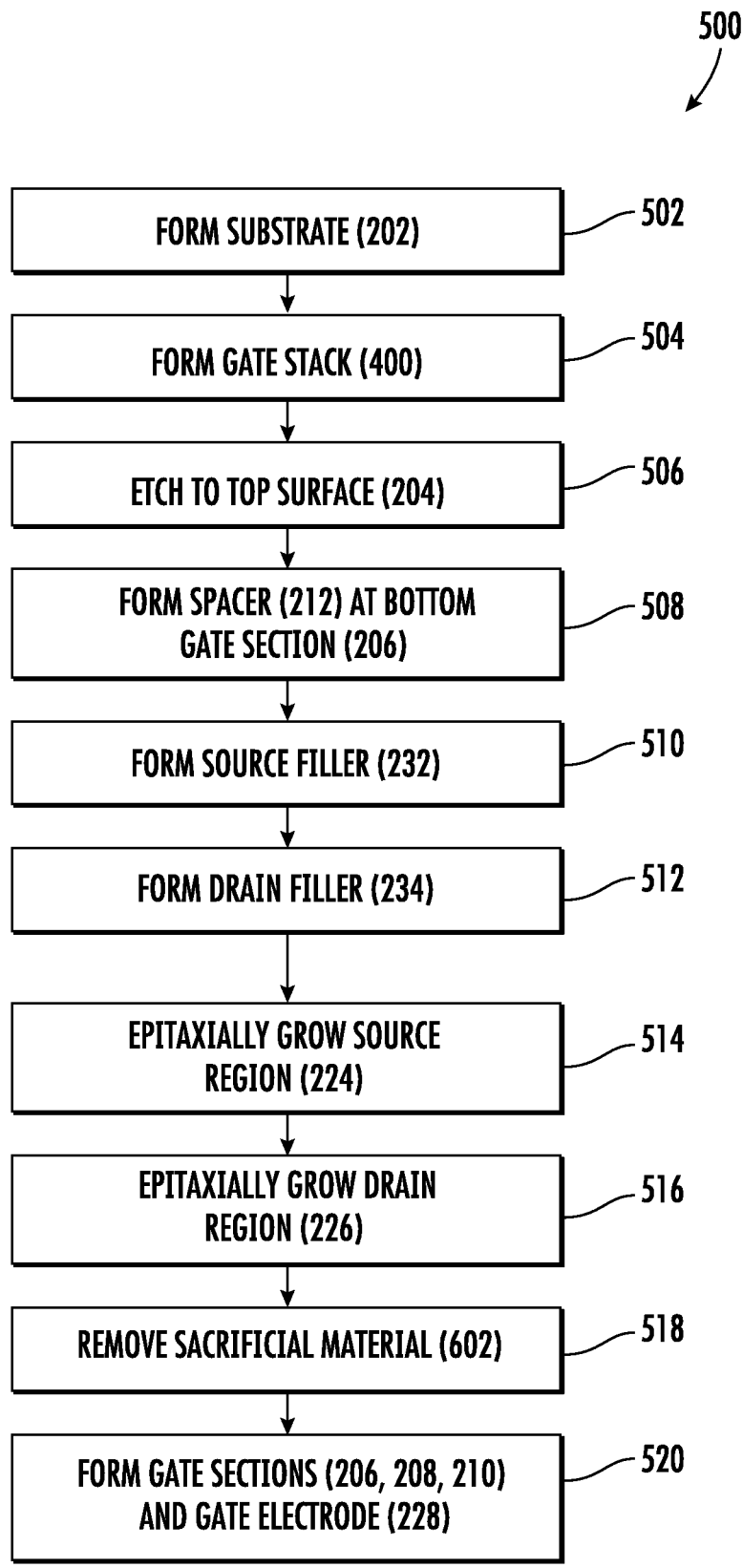
FIG. 5 is a flowchart illustrating an alternate exemplary process for manufacturing the GAA transistor of FIGS. 2A and 2B.

It should be appreciated that no current flows along the Z-axis at the level of the bottom gate section 206. Accordingly, there is no need for the source region 224 or the drain region 226 to extend below a bottom surface 230 of the bottom nanostructure 220(1). As noted above in the discussion of FIG. 1C, when the source and drain do extend below such a surface, parasitic capacitance may be formed between the source/drain and the bottom gate. Exemplary aspects of the present disclosure fill this space with a source filler 232 and a drain filler 234 such that the vertical dimension (i.e., the Y-axis) of the bottom gate section 206 is not overlapping with any of the source region 224 or the drain region 226. Thus, as used herein, a "filler" is a material that fills space and is less conductive than, in this case, the source region 224 or the drain region 226. More detail on the composition of the fillers is provided below with reference to FIGS. 3 and 5. The presence of the fillers makes the source region 224 and the drain region 226 "shallow" in that they do not extend as far towards the substrate 202 in the Y-axis dimension. While an exemplary aspect has no overlap between the source region 224 or the drain region 226 and the bottom gate section 206, it should be appreciated that the vagaries of manufacturing or design considerations may mean that there is some overlap in the vertical dimension. In an exemplary aspect, the fillers 232 and 234 extend from the substrate 202 to at least the gate top surface 206T. However, the use of the fillers 232 and 234 helps reduce the overlap and accordingly reduces the parasitic capacitance formed between the bottom gate section 206 and the source region 224 and between the bottom gate section 206 and the drain region 226.

Figure 3:
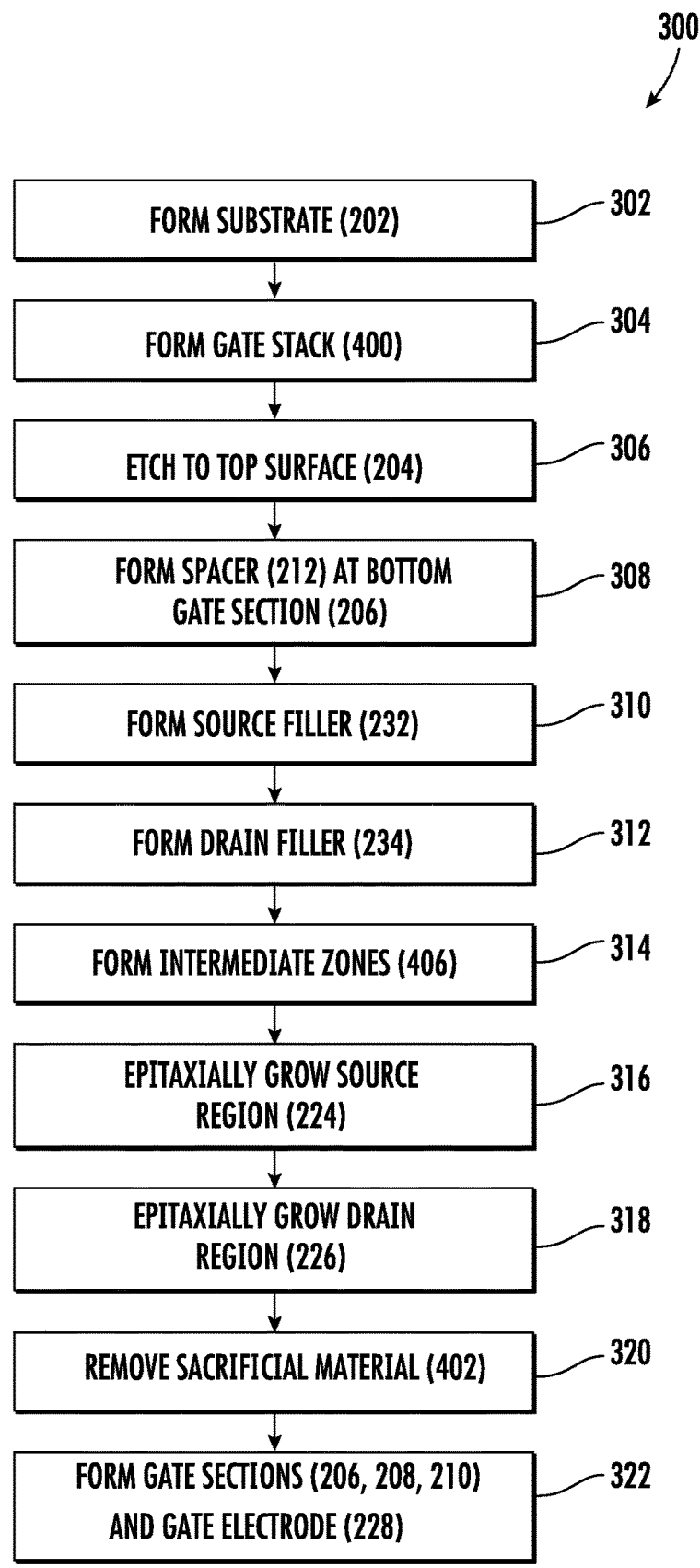
FIG. 3 is a flowchart illustrating an exemplary process for manufacturing the GAA transistor of FIGS. 2A and 2B.

A first exemplary process 300 for forming the GAA transistor 200 is illustrated in FIG. 3. FIGS. 4A-4F illustrate steps in the process 300. In this regard, the process 300 begins by forming a substrate 202 (block 302). As noted, this substrate 202 may have a planar top surface 204 relative to the Y-axis. A gate stack 400 (see FIG. 4A) is formed on the top surface 204 (block 304). The gate stack 400 includes sacrificial material 402 in place of the gate material 222 at this stage. The gate stack 400 includes the nanostructures 220(1)-220(3) (generically 220 in FIG. 4A), which as noted may be nanowires, nanosheets, or nanoslabs. The process 300 continues by etching down to the top surface 204 (block 306, see FIG. 4B) and forming the spacer 212 at the bottom gate section 206 (block 308) exposed by the etching.

It should be appreciated that the sources and drains of transistors may be formed from N-type material or P-type material depending on the intended use of the transistor and the characteristics desired. In many instances, transistors of both types may be integrated into a single integrated circuit (IC). However, because the underlying material is different, the steps may have variations when dealing with the different materials. The basic steps are the same. With this variation in mind, the process 300 continues by forming the source filler 232 (block 310). In an exemplary aspect, the source filler 232 may be about twenty percent (20%) of the total volume of the source region 224. The source filler 232 may be undoped silicon germanium SiGe, undoped silicon phosphorous (SiP), or a material having lower doping relative to the source region 224. For example, if the source region 224 is an N-type material, the dopant may be a phosphorous dopant and the source filler 232 may have a lower concentration (e.g., $1\times10^{15}$, per cubic centimeter ($cm^3$)) of phosphorous than the source region 224. If the source region 224 is a P-type material, the dopant may be a Boron Indium (BIn) dopant. The source filler 232 also can be a different material from the material of the source region 224. For example, a SiGe source filler 232 can be used with a Si source region 224 to induce more stress effect to further enhance current drivability. The variation in material or properties between the source filler 232 and the source region 224 has the net result of reducing capacitive coupling between the source filler 232 and the bottom gate section 206. In short, the source filler 232 may be low-doped, undoped, anti-doped, or include an insulator material so as to reduce coupling between the source filler 232 and the source region 224.

Likewise, the process 300 continues by forming the drain filler 234 (block 312). In an exemplary aspect, the drain filler 234 may be about twenty percent (20%) of the total volume of the drain region 226. The drain filler 234 may be undoped SiGe, undoped Si, or a material having lower doping relative to the drain region 226. In the event that the drain region 226 is SiGe, then the drain filler 234 may have a different concentration of Ge. For example, putting SiGe having an 80/20 ratio next to SiGe having a 60/40 ratio will generate stress due to lattice mismatch and reduce coupling (note that this is also true for the source region 224 and source filler 232). By way of further example, if the drain region 226 is an N-type material, the dopant may be a phosphorous dopant and the drain filler 234 may have a lower concentration (e.g., $1\times10^{15}$ per $cm^3$) of phosphorous than the drain region 226. If the drain region 226 is a P-type material, the dopant may be a Boron Indium (BIn) dopant. As with the source filler 232, the drain filler 234 also can be a different material from the material of the drain region 226. For example, a SiGe drain filler 236 can be used with a Si drain region 226 to induce more stress effect to further enhance current drivability The variation in material or properties between the drain filler 234 and the drain region 226 has the net result of reducing capacitive coupling between the drain filler 234 and the bottom gate section 206. In short, the source filler 236 may be low-doped, undoped, anti-doped, or include an insulator material so as to reduce coupling between the drain filler 234 and the drain region 226.

The process 300 continues by forming intermediate zones 406 (block 314, see FIG. 4C) atop the source filler 232 and the drain filler 234. The intermediate zones 406 may be formed by implanting an anti-dopant material. That is, the fillers 232 and 234 become semiconductor material with an anti-doping material added. Thus, for an N-type material, the anti-dopant material may be Boron and Indium having a concentration greater than $1\times10^{18}$ per $cm^3$, and for a P-type material, the anti-dopant material may be Arsenic and Phosphorous. It should be appreciated that the purpose of using an anti-dopant is to reduce source/drain dopant diffusion and reduce coupling between the source/drain and the bottom gate. The intermediate zones 406 are then cleaned such as with a hydrochloric (HCl) acid.

Figure 4:
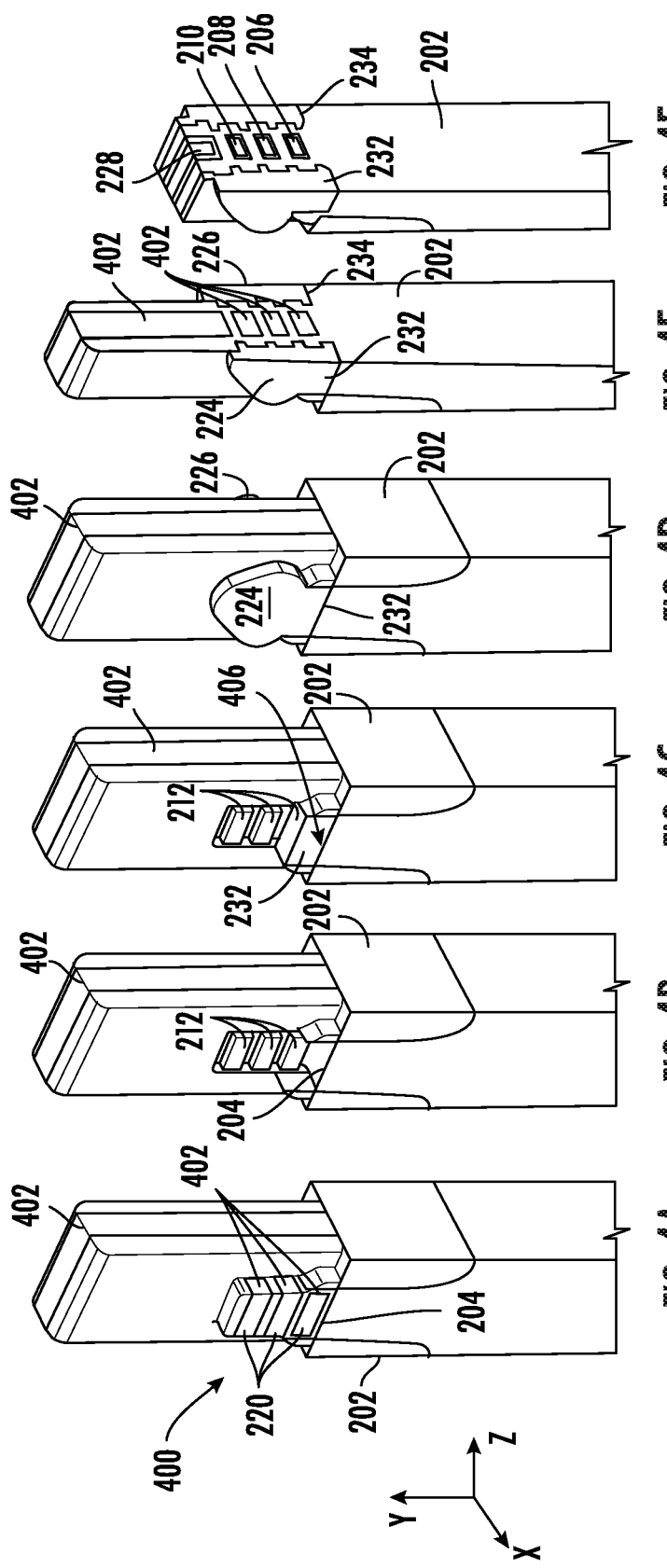
FIGS. 4A-4F are cross-sectional views of a GAA transistor made by the process of FIG. 3 taken at different process steps.

After cleaning, the source region 224 is epitaxially grown (block 316), and the drain region 226 is epitaxially grown (block 318, see FIG. 4D). The source region 224 and the drain region 226 may be doped at levels approximately $1E20/cm^3$ to $1E21/cm^3$.

The process 300 continues by removing the sacrificial material 402 (block 320, see FIGS. 4E and 4F) and forming the gate sections 206, 208, 210 and the gate electrode 228 (block 322, see FIG. 4F).

While not shown, additional implantation may be done and a heating step used to restore the crystal lattice of the source region 224 and the drain region 226. This heating step may additionally remove impurities as is well understood.

Instead of having an intermediate zone 406, the GAA transistor 200 may instead be formed by merely more strongly varying the type of material used for the fillers 232, 234 and the regions 224, 226. This process is illustrated as process 500 with reference to FIG. 5 and accompanying FIGS. 6A-6E. In this regard, the process 500 begins by forming a substrate 202 (block 502). As noted, this substrate 202 may have a planar top surface 204 relative to the Y-axis. A gate stack 600 (see FIG. 6A) is formed on the top surface 204 (block 504). The gate stack 600 includes sacrificial material 602 in place of the gate material 222 at this stage. The gate stack 600 includes the nanostructures 220(1)-220(3) (generically 220 in FIG. 6A), which as noted may be nanowires, nanosheets, or nanoslabs. The process 500 continues by etching down to the top surface 204 (block 506, see FIG. 6B) and forming the spacer 212 at the bottom gate section 206 (block 508) exposed by the etching.

The process 500 continues by forming the source filler 232 (block 610). In an exemplary aspect, the source filler 232 may be about twenty percent (20%) of the total volume of the source region 224. The source filler 232 may include an anti-dopant material such as Arsenic Phosphorous for a P-type source region 224 or Boron, Boron monofluoride Indium for an N-type source region 224, at concentrations of greater than $1\times10^{18}$ per $cm^3$.

Likewise, the process 500 continues by forming the drain filler 234 (block 512). In an exemplary aspect, the drain filler 234 may be about twenty percent (20%) of the total volume of the drain region 226. The drain filler 234 may include an anti-dopant material such as Arsenic Phosphorous for a P-type drain region 226 or Boron, Boron monofluoride Indium for an N-type drain region 226 at concentrations of greater than $1\times10^{18}$ per $cm^3$. The fillers 232 and 234 are then cleaned such as with a hydrochloric (HCl) acid.

Figure 6:
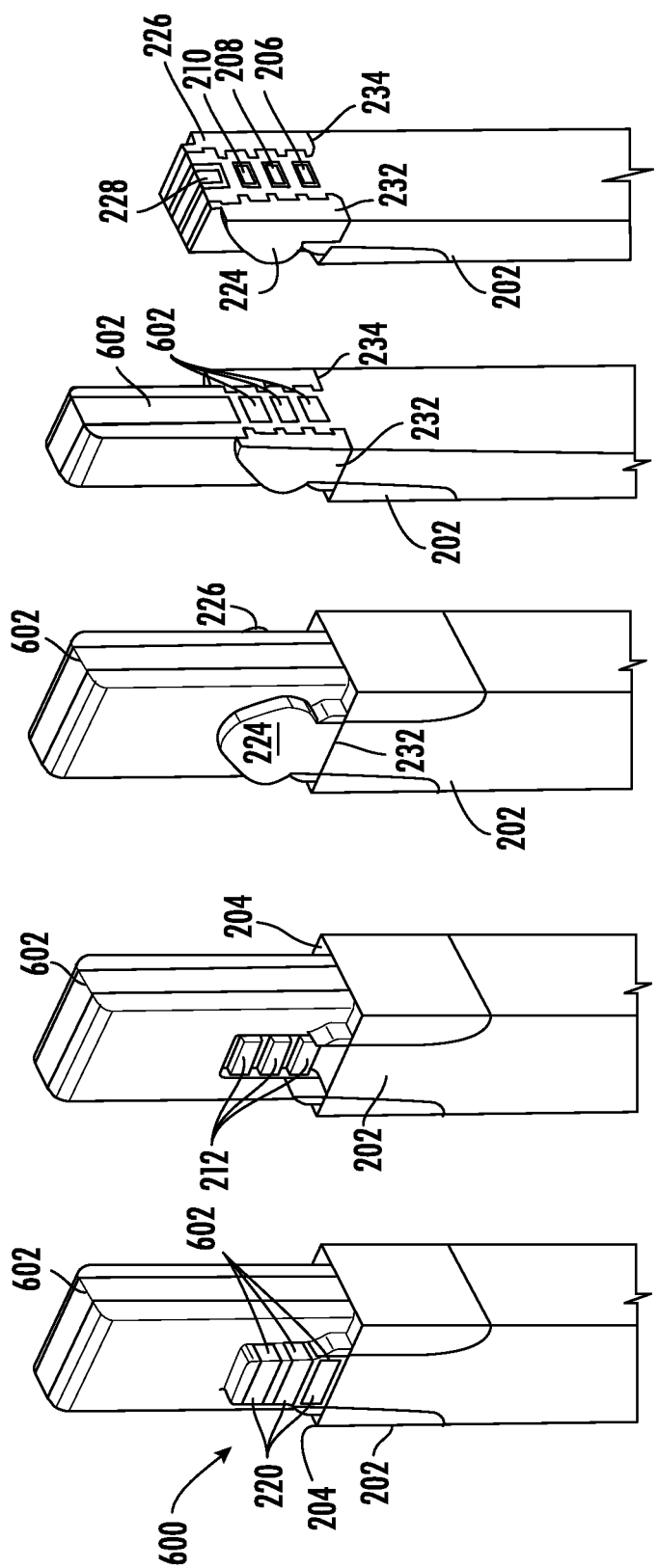
FIGS. 6A-6E are cross-sectional views of a GAA transistor made by the process of FIG. 5 taken at different process steps.

After cleaning, the source region 224 is epitaxially grown (block 514) and the drain region 226 is epitaxially grown (block 516, see FIG. 6C). The source region 224 and the drain region 226 may be doped at levels approximately $1E20/cm^3$ to $1E21/cm^3$.

The process 500 continues by removing the sacrificial material 602 (block 518, see FIGS. 6D and 6E) and forming the gate sections 206, 208, 210 and the gate electrode 228 (block 520, see FIG. 6E).

The GAA transistor with shallow source/drain regions according to aspects disclosed herein may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 7:
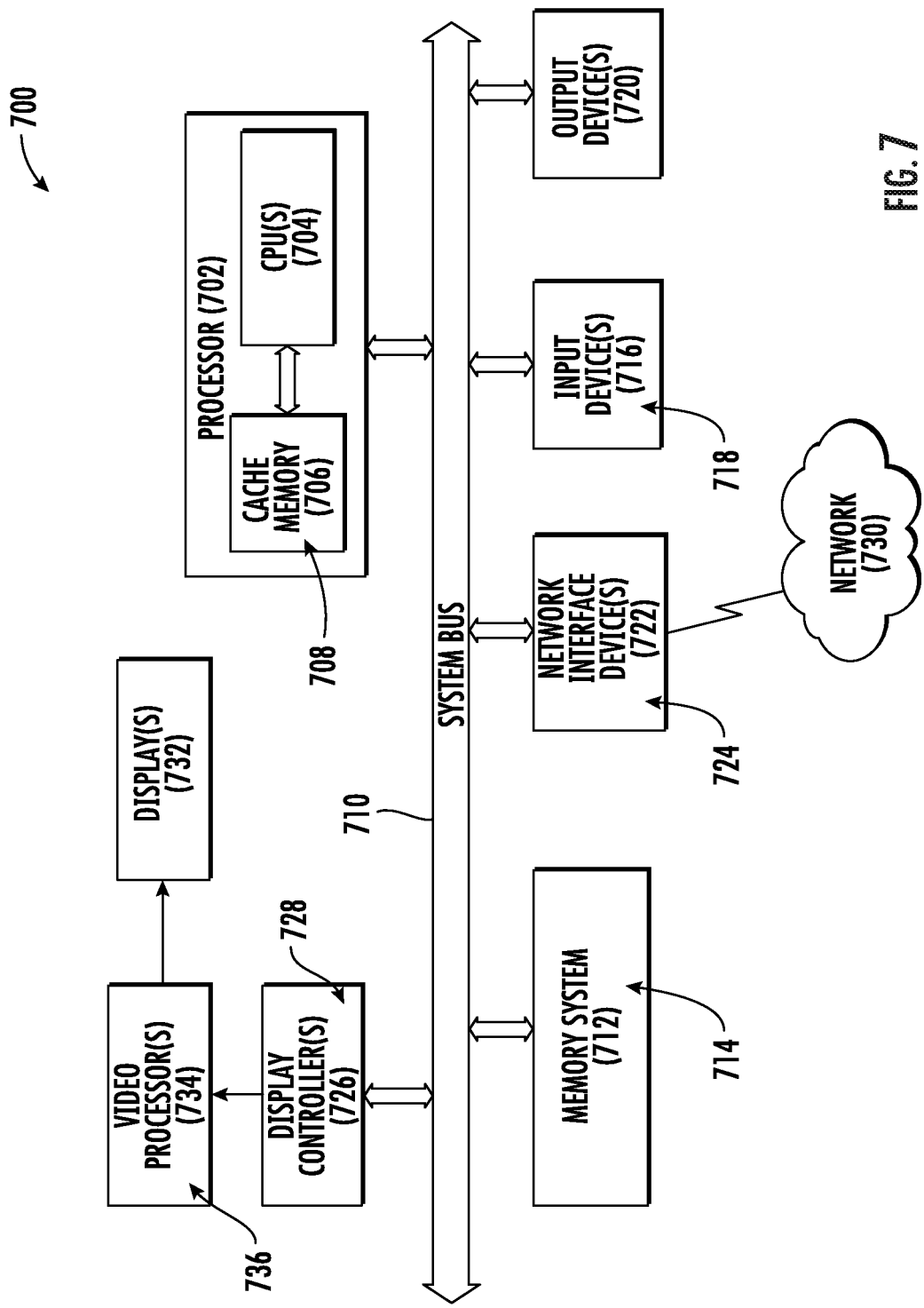
FIG. 7 is a block diagram of an exemplary processor-based system that can include integrated circuits (ICs) that include GAA transistors such as the GAA transistor of FIGS. 2A and 2B.

In this regard, FIG. 7 illustrates an example of a processor-based system 700 that can include GAA transistors 200 such as that illustrated in FIG. 2. In this example, the processor-based system 700 includes a processor 702 that includes one or more CPUs 704. The processor 702 may have cache memory 706 coupled to the CPU(s) 704 for rapid access to temporarily stored data. The cache memory 706 may include GAA transistors 708 such as the GAA transistor 200. The processor 702 is coupled to a system bus 710 and can intercouple master and slave devices included in the processor-based system 700. As is well known, the processor 702 communicates with these other devices by exchanging address, control, and data information over the system bus 710. Although not illustrated in FIG. 7, multiple system buses 710 could be provided, wherein each system bus 710 constitutes a different fabric. For example, the processor 702 can communicate bus transaction requests to a memory system 712 as an example of a slave device. The memory system 712 may include memory structures or arrays that include GAA transistors 714.

Other master and slave devices can be connected to the system bus 710. As illustrated in FIG. 7, these devices can include the memory system 712 and one or more input devices 716, which can include GAA transistors 718. The input device(s) 716 can include any type of input device, including, but not limited to, input keys, switches, voice processors, etc. These devices can also include one or more output devices 720 and one or more network interface devices 722, which can include GAA transistors 724. The output device(s) 720 can include any type of output device, including, but not limited to, audio, video, other visual indicators, etc. These devices can also include one or more display controllers 726, including GAA transistors 728. The network interface device(s) 722 can be any devices configured to allow exchange of data to and from a network 730. The network 730 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 722 can be configured to support any type of communications protocol desired.

The processor 702 may also be configured to access the display controller(s) 726 over the system bus 710 to control information sent to one or more displays 732. The display controller(s) 726 sends information to the display(s) 732 to be displayed via one or more video processors 734, which process the information to be displayed into a format suitable for the display(s) 732. The video processor(s) 734 can include GAA transistors 736. The display(s) 732 can include any type of display, including, but not limited to, a cathode ray tube (CRT), a liquid crystal display (LCD), a plasma display, a light emitting diode (LED) display, etc.

Figure 8:
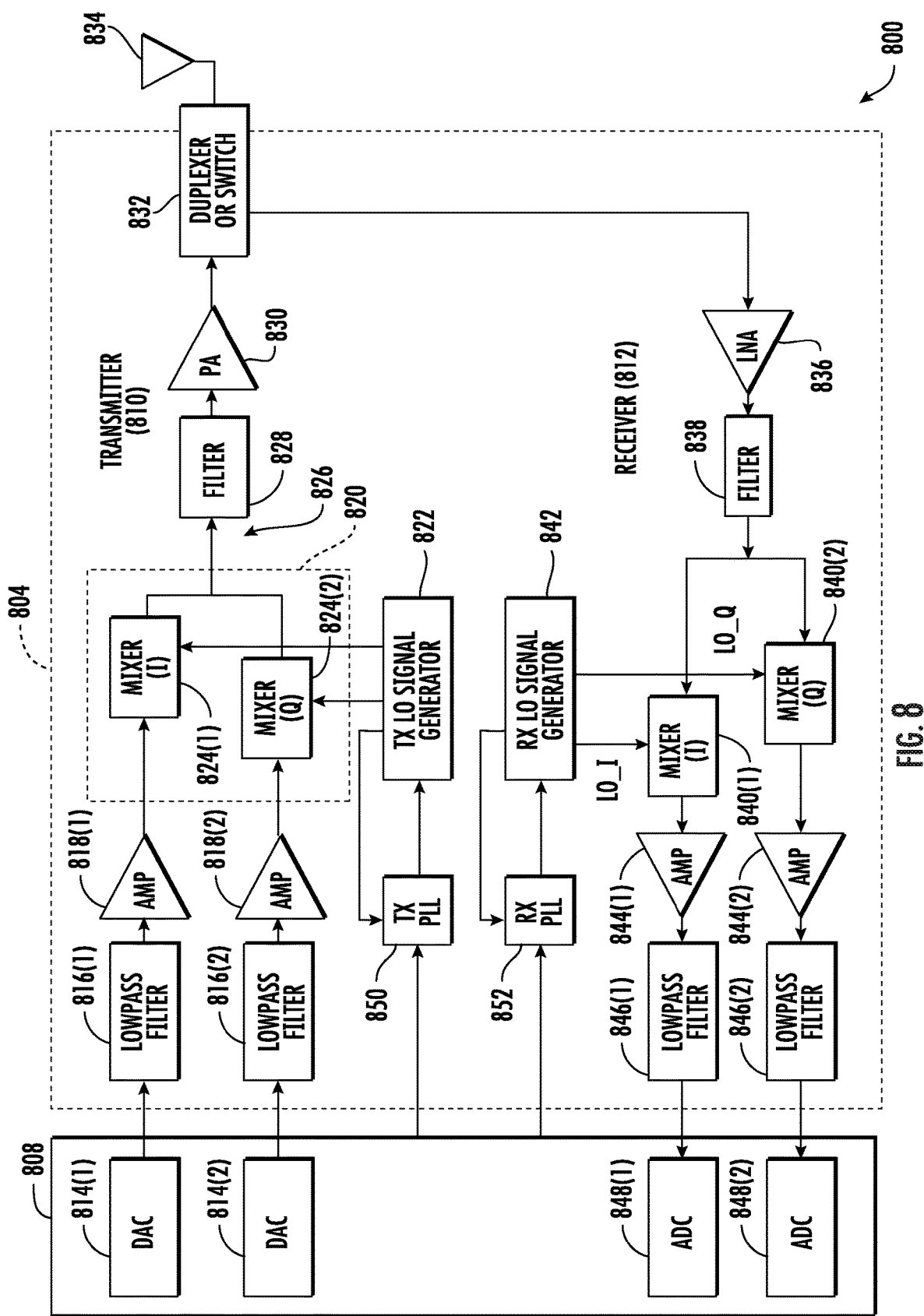
FIG. 8 is a block diagram of an exemplary wireless communications device that includes radio frequency (RF)

FIG. 8 illustrates an example of a wireless communications device 800 which can include RF components with GAA transistor 200. The wireless communications device 800 may include or be provided in any of the above-referenced devices, as examples. As shown in FIG. 8, the wireless communications device 800 includes a transceiver 804 and a data processor 808. The data processor 808 may include a memory (not shown) to store data and program codes. The transceiver 804 includes a transmitter 810 and a receiver 812 that support bi-directional communication. In general, the wireless communications device 800 may include any number of transmitters and/or receivers for any number of communication systems and frequency bands. All or a portion of the transceiver 804 may be implemented on one or more analog ICs, RF ICs (RFICs), mixed-signal ICs, etc.

A transmitter 810 or a receiver 812 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for a receiver 812. In the direct-conversion architecture, a signal is frequency converted between RF and baseband in one stage. The super-heterodyne and direct-conversion architectures may use different circuit blocks and/or have different requirements. In the wireless communications device 800 in FIG. 8, the transmitter 810 and the receiver 812 are implemented with the direct-conversion architecture.

In the transmit path, the data processor 808 processes data to be transmitted and provides I and Q analog output signals to the transmitter 810. In the exemplary wireless communications device 800, the data processor 808 includes digital-to-analog-converters (DACs) 814(1) and 814(2) for converting digital signals generated by the data processor 808 into the I and Q analog output signals, e.g., I and Q output currents, for further processing.

Within the transmitter 810, lowpass filters 816(1), 816(2) filter the I and Q analog output signals, respectively, to remove undesired images caused by the prior digital-to-analog conversion. Amplifiers (AMPs) 818(1), 818(2) amplify the signals from the lowpass filters 816(1), 816(2), respectively, and provide I and Q baseband signals. An upconverter 820 upconverts the I and Q baseband signals with I and Q transmit (TX) local oscillator (LO) signals through mixers 824(1), 824(2) from a TX LO signal generator 822 to provide an upconverted signal 826. A filter 828 filters the upconverted signal 826 to remove undesired images caused by the frequency upconversion as well as noise in a receive frequency band. A power amplifier (PA) 830 amplifies the upconverted signal 826 from the filter 828 to obtain the desired output power level and provides a transmit RF signal. The transmit RF signal is routed through a duplexer or switch 832 and transmitted via an antenna 834.

In the receive path, the antenna 834 receives signals transmitted by base stations and provides a received RF signal, which is routed through the duplexer or switch 832 and provided to a low noise amplifier (LNA) 836. The duplexer or switch 832 is designed to operate with a specific RX-to-TX duplexer frequency separation, such that RX signals are isolated from TX signals. The received RF signal is amplified by the LNA 836 and filtered by a filter 838 to obtain a desired RF input signal. Downconversion mixers 840(1), 840(2) mix an output of the filter 838 with I and Q receive (RX) LO signals (i.e., LO_I and LO_Q) from an RX LO signal generator 842 to generate I and Q baseband signals. The I and Q baseband signals are amplified by AMPs 844(1), 844(2) and further filtered by lowpass filters 846(1), 846(2) to obtain I and Q analog input signals, which are provided to the data processor 808. In this example, the data processor 808 includes analog-to-digital-converters (ADCs) 848(1), 848(2) for converting the analog input signals into digital signals to be further processed by the data processor 808.

In the wireless communications device 800 in FIG. 8, the TX LO signal generator 822 generates the I and Q TX LO signals used for frequency upconversion, while the RX LO signal generator 842 generates the I and Q RX LO signals used for frequency downconversion. Each LO signal is a periodic signal with a particular fundamental frequency. A transmit (TX) phase-locked loop (PLL) circuit 850 receives timing information from data processor 808 and generates a control signal used to adjust the frequency and/or phase of the TX LO signals from the TX LO signal generator 822. Similarly, a receive (RX) phase-locked loop (PLL) circuit 852 receives timing information from the data processor 808 and generates a control signal used to adjust the frequency and/or phase of the RX LO signals from the RX LO signal generator 842.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The devices described herein may be employed in any circuit, hardware component, IC, or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein, but is to be accorded the widest scope consistent with the principles and novel features disclosed herein.

What is claimed is:

1. An integrated circuit (IC) comprising:
  a gate-all-around (GAA) transistor comprising:
    a first gate section positioned adjacent to a planar first surface, the first gate section having a gate top surface;
    one of a source filler and a drain filler comprising a planar top surface, the one of the source filler and the drain filler positioned at one end of the first gate section and extending from the planar first surface to the gate top surface; and
    one of a source region and a drain region positioned at one end of a channel, adjacent to the one of the source filler and the drain filler and extending up from a plane defined by the gate top surface.

2. The IC of claim 1, wherein:
  the one of the source filler and the drain filler comprises the source filler; and
  the one of the source region and the drain region comprises the source region; and further comprising:
    the drain filler comprising a drain planar top surface positioned at another end of the first gate section and extending up from the planar first surface to the gate top surface; and
    the drain region positioned at another end of the channel, adjacent to the drain filler and extending up from the plane defined by the gate top surface.

3. The IC of claim 2, further comprising the channel, wherein the channel comprises a nanostructure.

4. The IC of claim 2, wherein the source region comprises an epitaxially-grown region.

5. The IC of claim 2, wherein the source filler is less conductive than the source region.

6. The IC of claim 2, wherein the source filler comprises an undoped semiconductor material.

7. The IC of claim 6, wherein the source filler comprises undoped silicon germanium (SiGe).

8. The IC of claim 6, wherein the source filler and the drain filler each comprise an insulator material.

9. The IC of claim 2, wherein the source filler comprises a semiconductor material comprising an anti-dopant material.

10. The IC of claim 9, wherein the anti-dopant material comprises Arsenic Phosphorous.

11. The IC of claim 10, wherein the anti-dopant material has a concentration greater than $1\times10^{18}$ per cubic centimeter ($cm^3$).

12. The IC of claim 2, further comprising a spacer between the first gate section and the source filler.

13. The IC of claim 2, wherein the source region comprises a dopant at a first concentration and the source filler comprises the dopant at a second concentration less than the first concentration.

14. The IC of claim 13, wherein the dopant comprises a phosphorous dopant.

15. The IC of claim 2, wherein the source region comprises a first material and the source filler comprises a second material different than the first material, the second material inducing stress on the first material to boost mobility in the first material.

16. The IC of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

17. A method for fabricating a gate-all-around (GAA) transistor, the method comprising:
   forming a first gate having a gate top surface on a planar top surface of a substrate;
   forming a channel on the gate top surface of the first gate;
   forming a source filler adjacent to the first gate from the planar top surface of the substrate to at least the gate top surface of the first gate, wherein the source filler has a planar top surface;
   forming a drain filler adjacent to the first gate from the planar top surface of the substrate to at least the gate top surface of the first gate;
   forming a source region on the planar top surface of the source filler; and
   forming a drain region on the drain filler.

18. The method of claim 17, further comprising forming a spacer between the first gate and the source filler.

19. The method of claim 17, wherein forming the channel comprises forming a nanostructure on the gate top surface of the first gate.

20. The method of claim 19, wherein forming the nanostructure comprises forming one of a nanowire, a nanosheet, or a nanoslab.

21. The method of claim 17, further comprising forming a plurality of gate sections over the channel.

22. The method of claim 17, further comprising etching the channel and exposing the planar top surface of the substrate.

23. The method of claim 17, wherein forming the source filler comprises epitaxially growing an undoped semiconductor material.

24. The method of claim 23, wherein epitaxially growing the undoped semiconductor material comprises epitaxially growing an undoped silicon germanium (SiGe) semiconductor material.

25. The method of claim 17, wherein forming the source filler comprises epitaxially growing a semiconductor material comprising an anti-dopant material.

26. The method of claim 17, wherein forming the source region comprises epitaxially growing the source region.

27. The method of claim 26, wherein epitaxially growing the source region comprises growing a doped source region.

28. The method of claim 27, wherein forming the source filler comprises growing the source filler at a first doping level below a second doping level of the doped source region.

29. An integrated circuit (IC) comprising:
   a substrate having a planar top surface; and
   a gate-all-around (GAA) transistor positioned on top of the substrate, the GAA transistor comprising:
      a bottom gate positioned above the planar top surface and parallel to the planar top surface, the bottom gate having a gate top surface;
      a channel positioned above the gate top surface and parallel to the planar top surface;
      a source filler positioned at one end of the bottom gate and extending up from the planar top surface to the gate top surface;
      a source region positioned at one end of the channel, on top of the source filler and extending up from a plane defined by the gate top surface;
      a drain filler positioned at another end of the bottom gate and extending up from the planar top surface to the gate top surface; and
      a drain region positioned at another end of the channel, on top of the drain filler and extending up from the plane defined by the gate top surface.

* * * * *